(12) United States Patent
Lee et al.

(10) Patent No.: US 10,818,533 B2
(45) Date of Patent: Oct. 27, 2020

(54) WAFER CENTERING DEVICE FOR MEASUREMENT APPARATUS

(71) Applicant: COMET CO., LTD., Gyeonggi-do (KR)

(72) Inventors: Gyu-Seong Lee, Gyeonggi-do (KR); Hye-Suk Jung, Gyeonggi-do (KR); Young-Jong Kwon, Gyeonggi-do (KR)

(73) Assignee: COMET CO., LTD., Gyeonggi-Do (KR)

(*) Notice: Subject to any disclaimer, the term of this patent is extended or adjusted under 35 U.S.C. 154(b) by 217 days.

(21) Appl. No.: 15/755,208

(22) PCT Filed: Sep. 1, 2016

(86) PCT No.: PCT/KR2016/009799
§ 371 (c)(1),
(2) Date: Feb. 26, 2018

(87) PCT Pub. No.: WO2017/043809
PCT Pub. Date: Mar. 16, 2017

(65) Prior Publication Data
US 2018/0261485 A1     Sep. 13, 2018

(30) Foreign Application Priority Data

Sep. 11, 2015 (KR) .................. 10-2015-0128832

(51) Int. Cl.
*H01L 21/68* (2006.01)
*H01L 21/687* (2006.01)
(Continued)

(52) U.S. Cl.
CPC ............ *H01L 21/68* (2013.01); *B23Q 1/56* (2013.01); *B24B 37/345* (2013.01);
(Continued)

(58) Field of Classification Search
CPC ............ H01L 21/68; H01L 21/67253; H01L 21/68721; H01L 21/683; H01L 21/682;
(Continued)

(56) References Cited

U.S. PATENT DOCUMENTS 3,466,514 A * 9/1969 Brunner ............ H01L 21/681
                                                                318/577
4,788,994 A * 12/1988 Shinbara ........ H01L 21/68792
                                                                134/157
(Continued)

FOREIGN PATENT DOCUMENTS

KR    20-1999-0037484 U    10/1999
KR    10-0554361 B1    2/2006
(Continued)

OTHER PUBLICATIONS

International Search Report from the Korean Intellectual Property Office in International Application No. PCT/KR2016/009799 dated Nov. 30, 2016.

*Primary Examiner* — Lee D Wilson
*Assistant Examiner* — Seahee Hong
(74) *Attorney, Agent, or Firm* — The Marbury Law Group, PLLC

(57) ABSTRACT

The present invention provides a wafer centering device for a measurement apparatus, the device comprising: a body unit; a guide unit which is installed in the body unit, has a support part for supporting a wafer, and has a through-hole and; and a displacement unit which is formed to be moved in the through-hole and has a pusher for moving the wafer on the support part.

8 Claims, 2 Drawing Sheets

(51) Int. Cl.
  *H01L 21/306*  (2006.01)
  *B23Q 1/56*  (2006.01)
  *B24B 37/34*  (2012.01)
  *H01L 21/67*  (2006.01)
(52) U.S. Cl.
  CPC .. *H01L 21/67253* (2013.01); *H01L 21/68721* (2013.01); *H01L 21/30625* (2013.01)
(58) Field of Classification Search
  CPC ........... H01L 21/687; B23Q 1/56; B23Q 3/18; B23Q 3/186; B24B 37/345; B25B 5/00; B25B 11/00; B25B 11/02; B25B 1/00; B25B 1/104
  USPC ...................................... 269/903, 289 R, 291
  See application file for complete search history.

(56) References Cited

U.S. PATENT DOCUMENTS

| | | | | |
|---|---|---|---|---|
| 5,493,784 A * | 2/1996 | Aiyama | ................ | A01D 75/20 30/276 |
| 5,851,041 A * | 12/1998 | Anderson | ................ | B25B 5/06 294/106 |
| 5,954,072 A * | 9/1999 | Matusita | ........... | H01L 21/68728 134/149 |
| 6,167,893 B1 * | 1/2001 | Taatjes | .............. | H01L 21/68728 134/147 |
| 6,273,484 B1 * | 8/2001 | Peng | ........................ | B25B 5/06 279/106 |
| 7,104,535 B2 * | 9/2006 | Kurita | ................ | G03F 7/70666 269/303 |
| 7,922,440 B2 * | 4/2011 | Du Bois | ................ | H01L 21/68 414/754 |
| 7,959,400 B2 * | 6/2011 | Hagio | ............ | H01L 21/68728 414/783 |
| 9,421,617 B2 * | 8/2016 | Goodman | ........... | B23B 31/1261 |
| 10,154,739 B2 * | 12/2018 | Turner | .................... | A47F 1/125 |
| 10,373,858 B2 * | 8/2019 | LaBrie | .............. | H01L 21/02041 |
| 2004/0005212 A1 * | 1/2004 | Wu | ................... | H01L 21/68728 414/757 |
| 2006/0266003 A1 * | 11/2006 | Topf | ....................... | B67C 3/007 53/281 |
| 2008/0202421 A1 * | 8/2008 | Allen | .................... | H01L 21/682 118/720 |

FOREIGN PATENT DOCUMENTS

| | | |
|---|---|---|
| KR | 10-2007-0069428 A | 7/2007 |
| KR | 10-2010-0047557 A | 5/2010 |
| KR | 10-2011-0053197 A | 5/2011 |

* cited by examiner

[FIG. 1]
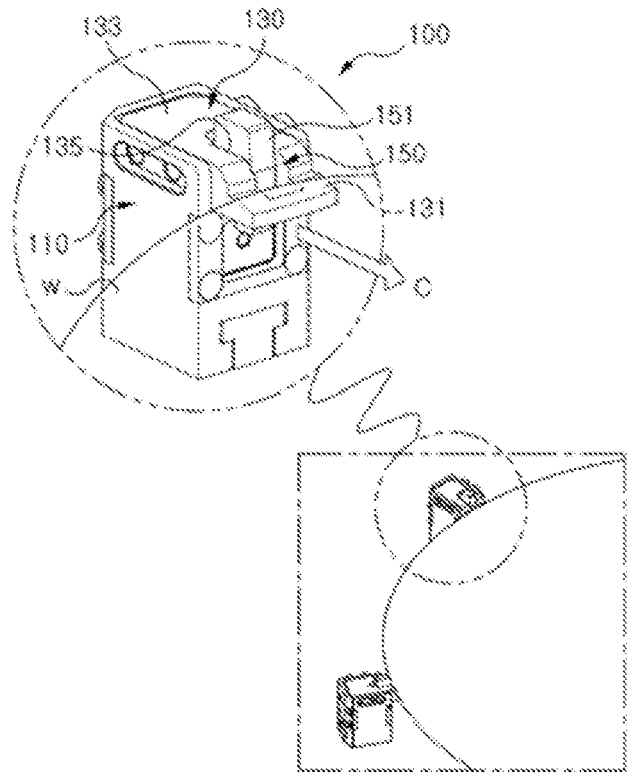
[FIG. 2]
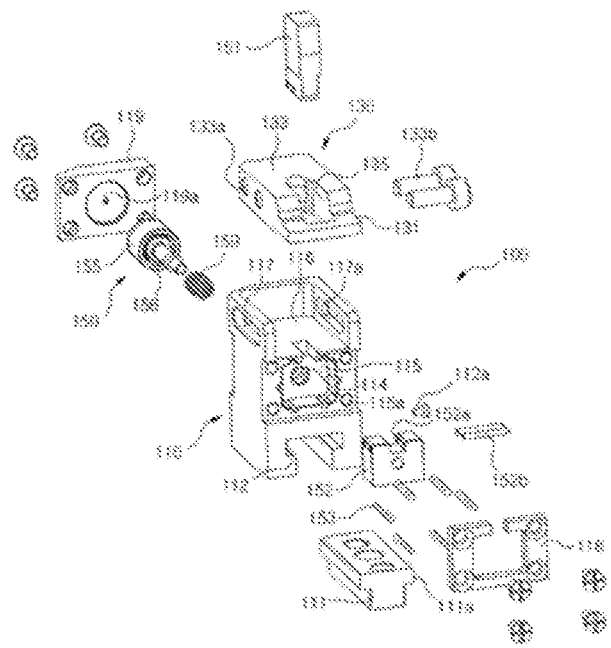

[FIG. 3]
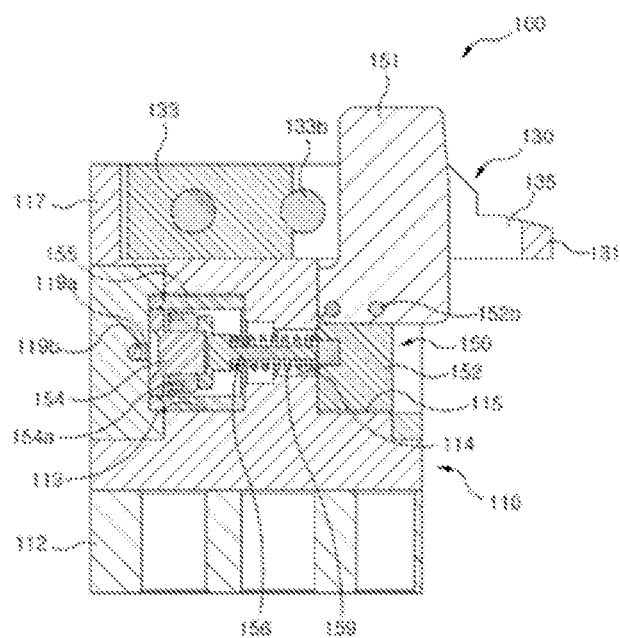

WAFER CENTERING DEVICE FOR MEASUREMENT APPARATUS

TECHNICAL FIELD

The present invention relates to a device for centering a wafer such that a measuring apparatus may measure the width of the wafer.

BACKGROUND

In general, CMP (Chemical Mechanical Polishing) is a process of lowering differences in the wiring of wafers and smoothing surfaces thereof.

In detail, CMP is a process in which a wafer, which is processed with CVD and is placed on a curvy pad on a platen, is attached to the device of head and the wafer is pressed while rotating.

After the CMP process, polish levels of the wafer are measured by a thickness measuring apparatus arranged after CMP equipment. However, as the wafers input to the measuring apparatus often fail to be centered, the measuring apparatus has a high error rate. This results in a reduction in the operation rate of the CMP equipment.

SUMMARY

The present invention is directed to providing a wafer centering device with respect to a measuring apparatus as a means to simply solve the problem of centering errors through a technical configuration.

To solve the above-described problems, a wafer centering device for a measuring apparatus according to an aspect of the present invention includes a body unit; a guide unit which has a support part installed in the body unit for supporting a wafer, and has a through-hole; and a displacement unit which has a pusher formed to move inside the through-hole such that the wafer may move on the support part.

The guide unit further includes an installing part which has a surface connected to the support part and higher than the support part, and the through-holes are formed on the installing part.

The through-holes are formed to extend from the installing part to the support part.

The displacement unit includes actuators which are connected to the pusher and allows the pusher to move; and a returning member which allows the actuators to be elastically supported with respect to the body unit such that the actuators after operation thereof may return to an initial position.

The body unit includes a driving space into which air flows; a passive space which is positioned on the opposite side of the driving space and in which the pusher is positioned; and a connecting space which links the driving space and the passive space and has a cross section smaller than the driving space and the passive space.

The returning member includes a spring which is positioned in the driving space and supported for a wall limiting the connecting space.

The actuators further include a passive block which is connected to the pusher and positioned in the passive space; and bearings for supporting the passive block.

The body unit further includes an accepting groove which is formed on an inner circumferential surface limiting the passive space so as to accept the bearings.

The actuators include a cylinder which is arranged in the driving space; a piston which is arranged in the cylinder and moves in the cylinder by the air; and a rod which connects the piston and the passive block.

The body unit includes a support part for supporting the installing part; and a limiting wall which is formed to protrude around the support part for limiting a moving path of the installing part.

The limiting wall includes joining holes which have a long hole shape extended along the moving direction of the installing part, and the installing part includes a though-hole into which joining pieces joined to the joining holes are inserted.

The body unit includes a mounter which is mounted on an object and has a sliding part; and a rail which is formed to movably accept the sliding part.

With the above-described configuration, a wafer centering device for a measuring apparatus according to the present invention may provide a solution to the problem of wafer centering errors with respect to a measuring apparatus.

By doing so, the operation rate of CMP equipment arranged before a measuring apparatus may be enhanced.

BRIEF DESCRIPTION OF THE DRAWINGS

FIG. 1 is a perspective view illustrating a state where a wafer centering device for a measuring apparatus 100 according to an embodiment of the present invention supports a wafer W.

FIG. 2 is an exploded perspective view illustrating the wafer centering device for a measuring apparatus 100 in FIG. 1.

FIG. 3 is a longitudinal sectional view of the wafer centering device for a measuring apparatus 100 in FIG. 1.

DETAILED DESCRIPTION

Hereunder, by reference to the accompanying drawings, a wafer centering device for a measuring apparatus according to preferred embodiments of the present invention will be described in detail. Throughout this specification, the same/similar reference numerals designate the same/similar elements, and description thereof is replaced with initial description thereof.

FIG. 1 is a perspective view illustrating a state where a wafer centering device for a measuring apparatus 100 according to an embodiment of the present invention supports a wafer W.

By reference to the drawing, the wafer centering device for a measuring apparatus 100 may have a body unit 110, a guide unit 130, and a displacement unit 150.

The body unit 110 is configured to be installed in CMP, an object. The body unit 110 is an object in which the guide unit 130 and the displacement unit 150 are installed.

The guide unit 130 supports the wafer W and is configured to guide operation of the displacement unit 150. In detail, the guide unit 130 may have a support part 131, an installing part 133, and a through-hole 135.

The support part 131 supports the wafer W. The installing part 133 extends from the support part and is installed in the body unit 110. At this time, the installing part 133 has a surface which is higher than the support part 131. The through-hole 135 is formed in the installing part 133 and may extend to the support part 131.

The displacement unit 150 is configured to displace the wafer W, supported by the support part 131, in the center direction C of the regular position thereof. The displacement unit 150 may have a pusher 151 which is arranged inside the through-hole 135 and moves along the direction in which the through-hole 135 extends.

With this configuration, the body unit 110 is installed in a portion, out of CMP, where the wafer W will be installed. At this time, a plurality of wafer centering devices 100 may be provided so as to draw a circle corresponding to the shape of the wafer W.

By doing so, the wafer W is placed in the support part 131 of the guide unit 130 and afterwards the plurality of wafer centering devices 100 may operate together. In detail, each of the wafer centering device 100 drives the pusher 151 such that the wafer W may move in the center direction C.

As a result, the wafer W may be regularly positioned in the center position moved by the plurality of wafer centering devices 100.

Regarding the detailed configuration of such a wafer centering device 100 will be described by reference to FIGS. 2 and 3.

FIG. 2 is an exploded perspective view illustrating the wafer centering device for a measuring apparatus 100 in FIG. 1, and FIG. 3 is a longitudinal sectional view of the wafer centering device for a measuring apparatus 100 in FIG. 1.

By reference to the drawings, the body unit 110 may have a mounting module, an operating space, a support module, and a covering module.

The mounting module may have a mounter 111 and a rail 112.

The mounter 111 is a bracket mounted on a CMP. A sliding part 111A may be formed on the upper portion of the mounter 111 to protrude in the side direction.

The rail 112 is configured to movably accept the sliding part 111A of the mounter 111. A portion, out of the body unit 110, where the rail 112 is positioned is fixed to the mounter 111 by a fixing piece 112A which penetrates the rail to be pressed to the sliding part 111A.

The operating space is formed to penetrate the body unit 110. The operating space may have a driving space 113, a connecting space 114 and a passive space 115.

The driving space 113 is positioned on the left side of the drawing illustrating the body unit 110 and the space where air flows in. The connecting space 114 connects the driving space 113 and the passive space 115 and may have a cross section which is smaller than the driving space 113 and the passive space 115. The passive space 115 is positioned on the opposite side of the driving space 113.

The support module is configured to support the guide unit 130 and limit the moving path thereof. The support module may have a support part 116 and a limiting wall 117.

The support part 116 has a surface supporting the guide unit 130. The limiting wall 117 is formed to protrude along the circumference of the support part 116. Joining holes 117A with a long hole shape may be formed on the limiting wall 117.

The covering module may have a limiting plate 118 formed to cover the side of the passive space 115 and an outlet plate 119 formed to cover the side of the driving space 113.

The limiting plate 118 blocks bearings 153 from moving outward. The outlet plate 119 allows the air input from the outside to flow out into the driving space 113. To this end, an outlet mouth 119A and a flow channel 119B connected thereto may be formed in the outlet plate 119.

Through-holes 133A may be formed in the installing part 133 of the guide unit 130. These through-holes 133A accept joining pieces 133B penetrating the through-holes and joined to the joining holes 117A. By doing so, the guide unit 130 may be fixed in an adjusted position along the direction in which the joining holes 117A extend in the state where the guide unit 130 is supported by the support part 116.

The displacement unit 150 may have a passive block 152, an acting module, and a returning member 159 in addition to the pusher 151. Herein, the passive block 152 and the acting module may be all referred to as actuators.

The passive block 152 is positioned in the passive space 155, and connected to the acting module and the pusher 151.

The passive block 152 has a settling part 152A where the pusher 151 is settled, and coupling pins 152B which cross the settling part 152A to allow the pusher 151 to be coupled to the passive block 152. Furthermore, the passive block 152 is supported by the bearings 153 accepted in the accepting groove 115A formed on the inner circumferential surface limiting the passive space 155.

The acting module may have a piston 154, a cylinder 155 and a rod 156.

The piston 154 is positioned inside the cylinder 155, and moves on the right side on the drawings when air is provided from the outlet mouth 119A. The piston 154 may be coupled to a sealing member 154A so as to seal its gap with the cylinder 155.

The cylinder 155 is installed in the driving space 113. The rod 156 is connected to the piston 154. Also, the rod 156 is connected to the passive block 152 by passing the connecting space 114.

The returning member 159 may be a compression coil spring having a hollow part where the rod 156 is inserted. The returning member 159 allows the rod 156 to be elastically supported with respect to the wall limiting the connecting space 114. However, as in FIG. 3, the returning member 159 may be formed to be supported with respect to the passive block 152.

With this configuration, the air, flowing from an external air tank to the flow channel 119B, flows out to the driving space 113 through the outlet mouth 119A. The piston 154 gains strength from the air flowing out so as to move on the right side on the drawings.

When the piston 154 moves, the rod 156 and the passive block 152 connected to the piston 154 also move to the right side. This causes the wafer W to move while the pusher 151 connected to the passive block 152 moves in the center direction C.

In this process, the spring, the returning member 159 is elastically compressed as the rod 156 moves on the right side. Afterwards, the returning member 159 returns to its initial state when air is not provided for the piston 154. The restoring force of the returning member 159 makes the piston 154, the rod 156, the passive block 152 as well as the pusher 151 to return to their initial position.

The wafer centering device for a measuring apparatus should not be construed as limited to the configuration and operating method of the embodiments described above. Some or all of the embodiments described above may be configured to selectively combine to make various modifications.

INDUSTRIAL APPLICABILITY

The present invention is industrially applicable in the industry for manufacturing wafer centering devices for measuring apparatuses.

What is claimed is:

1. A wafer centering device for a measuring apparatus comprising:

a body unit;

a guide unit that has a support part installed in the body unit for supporting a wafer, wherein the guide unit includes a through-hole extending entirely there through, wherein the guide unit further comprises:

an installing part which is connected to the support part and has a surface higher than the support part, and wherein the through-hole is formed on the installing part; and a displacement unit that has a pusher extending entirely through the through-hole, wherein the pusher is configured to move inside the through-hole to push the wafer relative to the support part, wherein the displacement unit comprises:

actuators that are connected to the pusher and configured to move the pusher; and a returning member that biases the actuators elastically to return to an initial position after operation thereof, wherein the body unit comprises:

a driving space configured to receive air pressure;

a passive space that is positioned on an opposite side of the body unit as the driving space and in which the pusher is positioned; and a connecting space that links the driving space and the passive space and has a cross section smaller than the driving space and the passive space, wherein the actuators comprise:

a cylinder which is arranged in the driving space;

a piston arranged in the cylinder and configured to move within the cylinder by the air pressure in the driving space; and a rod that connects the piston and a passive block such that the returning member is elastically compressed as the rod moves toward the passive space, and wherein the piston is coupled to a sealing member that seals a gap between the piston and the cylinder.

2. The wafer centering device for the measuring apparatus according to claim 1, wherein the through-hole is formed to extend from the installing part to the support part.

3. The wafer centering device for the measuring apparatus according to claim 1, wherein the returning member comprises a spring that is positioned in the driving space and supported with respect to a wall limiting the connecting space.

4. The wafer centering device for the measuring apparatus according to claim 1, wherein the passive block is connected to the pusher and positioned in the passive space.

5. The wafer centering device for the measuring apparatus according to claim 4, wherein the body unit further comprises an accepting groove that is formed on an inner circumferential surface limiting the passive space.

6. The wafer centering device for the measuring apparatus according to claim 1, wherein the body unit comprises:

a support part for supporting the installing part; and a limiting wall protruding around the support part so as to limit a moving path of the installing part.

7. The wafer centering device for the measuring apparatus according to claim 6, wherein the limiting wall comprises joining holes that extend along the moving direction of the installing part, and wherein the installing part comprises through-holes into which joining pieces joined to the joining holes are inserted.

8. The wafer centering device for the measuring apparatus according to claim 1, wherein the body unit comprises:

a mounter which is mounted on an object and has a sliding part; and a rail which is formed to movably accept the sliding part.

* * * * *